US009685359B2

(12) United States Patent
Funato et al.

(10) Patent No.: US 9,685,359 B2
(45) Date of Patent: Jun. 20, 2017

(54) LOAD PORT DEVICE

(71) Applicant: SINFONIA TECHNOLOGY CO., LTD., Tokyo (JP)

(72) Inventors: Manabu Funato, Tokyo (JP); Mitsuo Natsume, Tokyo (JP); Mitsutoshi Ochiai, Tokyo (JP)

(73) Assignee: SINFONIA TECHNOLOGY CO., LTD., Tokyo (JP)

( * ) Notice: Subject to any disclaimer, the term of this patent is extended or adjusted under 35 U.S.C. 154(b) by 609 days.

(21) Appl. No.: 14/199,051

(22) Filed: Mar. 6, 2014

(65) Prior Publication Data

US 2014/0338288 A1     Nov. 20, 2014

(30) Foreign Application Priority Data

May 16, 2013   (JP) .................................. 2013-103767

(51) Int. Cl.
*H01L 21/677*     (2006.01)
*H01L 21/67*      (2006.01)
*H01L 21/673*     (2006.01)

(52) U.S. Cl.
CPC .. *H01L 21/67706* (2013.01); *H01L 21/67265* (2013.01); *H01L 21/67379* (2013.01); *H01L 21/67772* (2013.01); *H01L 21/67775* (2013.01)

(58) Field of Classification Search
CPC ... H01L 21/677; H01L 21/673; Y10T 16/544; Y10T 16/5443; Y10T 16/5444;

(Continued)

(56) References Cited

U.S. PATENT DOCUMENTS

| 4,106,237 A * | 8/1978 | Bierlich .................... E05D 3/18 49/249 |
| 6,430,802 B1 * | 8/2002 | Miyajima ......... H01L 21/67373 206/711 |

(Continued)

FOREIGN PATENT DOCUMENTS

| JP | 2011165719 A * | 8/2011 |
| JP | 2012-54271 A | 3/2012 |
| WO | 2007/008677 A2 | 1/2007 |

OTHER PUBLICATIONS

Extended European Search Report dated Oct. 8, 2014, issued in corresponding EP Application No. 14157765.0 (6 pages).

*Primary Examiner* — Thanh Truong
*Assistant Examiner* — Dariush Seif
(74) *Attorney, Agent, or Firm* — Westerman, Hattori, Daniels & Adrian, LLP

(57) ABSTRACT

A load port device comprises a link mechanism that has a main moving link whose one end is connected with a door holding member in a rotatable manner, a guide that bends and extends from a horizontal direction to a vertical direction and that guides one end of the main moving link, a main moving block with which the other end of the main moving link is connected in a rotatable manner and a door hoisting shaft that extends in the vertical direction and that moves the main moving block in the extending direction. The link mechanism allows the end of the main moving link to move from the horizontal direction to the vertical direction or from the vertical direction to the horizontal direction along the guide in a state that the other end of the main moving link moves to the vertical direction.

9 Claims, 8 Drawing Sheets

(58) Field of Classification Search
CPC ............. Y10T 16/5448; Y10T 16/5474; Y10T 16/5475; Y10T 16/5476; E05C 3/002; E05D 3/14; E05D 15/1013; E05D 3/142; E05D 3/16; E05D 3/18; E05F 1/046; E05F 1/043
USPC ....... 49/153, 426, 205, 213; 141/63; 16/368, 16/369; 901/2, 30, 14, 19, 28, 46, 47
See application file for complete search history.

(56) References Cited

U.S. PATENT DOCUMENTS

| | | | | |
|---|---|---|---|---|
| 6,539,669 B1* | 4/2003 | Heidrich | ............... | B61D 19/008 16/87 R |
| 7,147,424 B2* | 12/2006 | Weaver | ............. | H01L 21/67772 414/217 |
| 7,467,919 B2* | 12/2008 | Weaver | ............. | H01L 21/67772 414/684.3 |
| 7,654,291 B2* | 2/2010 | Miyajima | ......... | H01L 21/67017 141/4 |
| 8,251,636 B2* | 8/2012 | Sasaki | ............... | H01L 21/67772 414/411 |
| 8,322,759 B2* | 12/2012 | Okabe | ................ | E05B 17/0029 206/710 |
| 8,485,771 B2* | 7/2013 | Sasaki | ............... | H01L 21/67373 141/51 |
| 8,591,163 B2* | 11/2013 | Toyoda | ................. | H01L 21/67 414/217.1 |
| 8,821,099 B2* | 9/2014 | Hall | ................. | H01L 21/67775 118/500 |
| 8,893,753 B2* | 11/2014 | Okabe | ............... | H01L 21/67376 141/286 |
| 8,978,718 B2* | 3/2015 | Emoto | ............... | H01L 21/67017 141/51 |
| 9,153,468 B2* | 10/2015 | Emoto | ............. | H01L 21/67772 |
| 2002/0015636 A1* | 2/2002 | Lee | .................. | H01L 21/67772 414/407 |
| 2002/0044859 A1* | 4/2002 | Lee | .................. | H01L 21/67775 414/411 |
| 2002/0064439 A1* | 5/2002 | Otaguro | ........... | H01L 21/67265 414/217.1 |
| 2002/0069933 A1* | 6/2002 | Otaguro | ........... | H01L 21/67772 141/98 |
| 2003/0141217 A1* | 7/2003 | Park | .................. | H01L 21/67373 206/711 |
| 2005/0111943 A1* | 5/2005 | Otaguro | ........... | H01L 21/67772 414/411 |
| 2006/0245849 A1* | 11/2006 | Yokoyama | ........ | H01L 21/67772 414/217 |
| 2007/0009345 A1* | 1/2007 | Hall | .................. | H01L 21/67775 414/222.01 |
| 2007/0151619 A1* | 7/2007 | Okabe | ............... | H01L 21/67772 141/63 |
| 2007/0151620 A1* | 7/2007 | Okabe | ............... | H01L 21/67017 141/63 |
| 2008/0115322 A1* | 5/2008 | Migli | ...................... | E05D 15/46 16/283 |
| 2009/0245981 A1* | 10/2009 | Miyajima | ......... | H01L 21/67373 414/222.02 |
| 2010/0133270 A1* | 6/2010 | Okabe | ............... | H01L 21/67772 220/212 |
| 2011/0005868 A1* | 1/2011 | Suzuki | ............. | H01L 21/67772 187/391 |
| 2011/0188977 A1* | 8/2011 | Toyoda | ................. | H01L 21/673 414/411 |
| 2012/0034051 A1* | 2/2012 | Asa | ................... | H01L 21/67772 414/217 |
| 2015/0152672 A1* | 6/2015 | Tsai | .................. | H01L 21/67126 292/198 |

* cited by examiner

LOAD PORT DEVICE

FIELD OF THE ART

This invention relates to a load port device that can restrain generation of particles at a time when a FOUP door is open or closed.

BACKGROUND ART

A hermetic type storage container called as the FOUP (Front Open Unified Pod) is used in a semiconductor manufacturing process. The FOUP accommodates, for example, semiconductor wafers and is used for transporting the semiconductor wafers between semiconductor processing systems.

The patent document 1 discloses a load port device that is used for transporting semiconductor wafers housed in the FOUP to the inside of the semiconductor processing system.

The load port device comprises a first driving unit that moves a holding member by which a door of the FOUP is held in the horizontal direction to approach or to be separated from the FOUP, and a second driving unit that moves the separated holding member in the vertical direction. The first driving unit has a first guide rail that extends in the horizontal direction and the second driving unit has a second guide rail that extends in the vertical direction, and the holding member is moved along the first and second guide rails so that the door of the FOUP is open or closed.

PRIOR ART DOCUMENTS

Patent Document

Patent document 1: Japanese Unexamined Patent Application Publication No. 2012-54271

DISCLOSURE OF THE INVENTION

Problems to be Solved by the Invention

However, recently, wiring that is formed on a surface of a semiconductor wafer has been more and more refined so that it might fail to obtain an expected performance because a quality of the semiconductor wafer is degraded due to a small amount of particles that attach to the surface of the semiconductor wafer.

Similar to the load port device disclosed in the patent document 1, if a driving mechanism regarding opening/closing the door and a driving mechanism regarding hoisting are separately provided, there is a problem that particles generate at a position where guide rails are connected. Concretely, since two driving mechanisms are provided, the configuration becomes complicated so that it becomes difficult to realize a smooth opening/closing movement. As a result of this, particles easily generate due to a load applied to the connected portion of the guide rail. In addition, when one of the driving mechanisms is operated, vibration or shock is transmitted to the other driving mechanism so that particles might generate in the inside of each driving mechanism. Furthermore, since the opening/closing movement of the door that uses two driving mechanisms is not conducted smoothly, particles might generate also in the door holding member that holds the door.

The present claimed invention intends to solve all of the problems effectively and a main object of this invention is to provide a load port device that can restrain generation of particles at a portion where a shaft such as a guide rail or the like is connected in case of opening/closing a door of the FOUP and that can make an opening/closing movement of the door smoothly.

Means to Solve the Problems

In order to attain the above-mentioned object, the present claimed invention takes the following measures.

More specifically, a load port device in accordance with this invention is the one that supports a storage container that can house a plurality of semiconductor wafers and that opens or closes a door of the storage container by mutually moving the door from a first direction to a second direction that is different from the first direction, and the load port device comprises a door holding member that holds the door of the storage container, a link mechanism that has a main moving link whose one end is connected with the door holding member in a rotatable manner, a guide device that bends and extends from the first direction to the second direction and that guides the one end of the main moving link, a reciprocating moving device that has at least one main moving member with which the other end of the main moving link is connected in a rotatable manner and that allows the door holding member to make a reciprocating movement, a main shaft that extends in the second direction and that moves the main moving member in the extending direction, and a driving device that drives the main moving member along the main shaft, wherein the link mechanism is so configured that the above-mentioned one end of the main moving link is allowed to move from the first direction to the second direction or from the second direction to the first direction along the guide device in a state that the other end of the main moving link moves to the second direction.

With the above-mentioned arrangement, one end of the main moving link moves from the first direction to the second direction or from the second direction to the first direction along the guide device in conjunction with the reciprocal movement of the main moving member in the second direction. As a result, it is possible to open or close the door of the housing container held by the door holding member with a smooth movement of each member just by activating the main moving member on a single main shaft so that it is possible to restrain generation of particles at a portion where two shafts are connected and to smoothly open and close the door. In addition, since the main moving link is used to transfer the moving force of the main moving member in the second direction to the moving force of the door holding member from the first direction to the second direction, it is possible to smoothly transfer the moving force so that generation of the particles can be furthermore prevented. Furthermore, since only one main shaft is required, it is possible both to simplify the configuration of the system and to make a number of the driving source single, thereby restraining the manufacturing cost.

In order to furthermore prevent generation of particles by moving the door holding member smoothly and stably to the first direction and the second direction, it is preferable that the reciprocating moving device further comprises a sub moving member that is supported by the main shaft in a state of being able to move in the second direction and being separated from the main moving member, the link mechanism further comprises a sub moving link whose one end is connected with the main moving link in a rotatable manner and whose other end is connected with the sub moving member in a rotatable manner, and the door holding member is supported by the sub moving member in a state of being able to move in the first direction.

It is also preferable that the reciprocating moving device further comprises a second moving member that is driven by the driving device and that can move in the second direction along the main shaft, the guide device comprises a first guide part and a second guide part whose shape is the same as that of the first guide part, the link mechanism constitutes a parallel link by a link whose one end is guided by the second guide part and whose other end is connected with the second moving member in a rotatable manner and the main moving link, and the door holding member is supported by the second moving member in a state of being able to move in the first direction.

In order to give a high tightening force to the door holding member without providing an additional tightening mechanism, it is preferable that the link mechanism and the guide device constitute a tightening mechanism that produces a toggle effect in a case that the other end of the main moving link moves in the second direction and the one end of the main moving link moves in the first direction in order to close the door.

Furthermore, in order to improve a closing force of the door through the above-mentioned toggle effect, it is preferable that the first direction is a direction generally orthogonal to a mounting surface of the door of the storage container.

Even though particles generates on the main shaft or the like, in order to make the semiconductor processing system difficult to generate the particles inside of the semiconductor processing system it is preferable that a plate shape base member to one surface of which the guide member and the main shaft are fixed is further comprised, a member insertion opening that extends in the second direction and through which the door holding member is inserted and passes is formed on the base member, the door holding member extends from the above-mentioned one surface side of the base member to the other surface side of the base member through the member insertion opening, and the door holding member is connected with the one end of the main moving link on the above-mentioned one surface side, while holding the door on the above-mentioned other surface side.

Effect of the Invention

In accordance with the above-explained invention, since it is possible both to open or close the FOUP door by moving the door holding member in the first direction and the second direction and to make the movement of each member smooth associated with the movement of opening or closing the FOUP door by the use of the link mechanism, it is possible to provide the load port device that can restrain generation of the particles.

BEST MODES OF EMBODYING THE INVENTION

One embodiment of this invention will be explained with reference to drawings.

Figure 1:
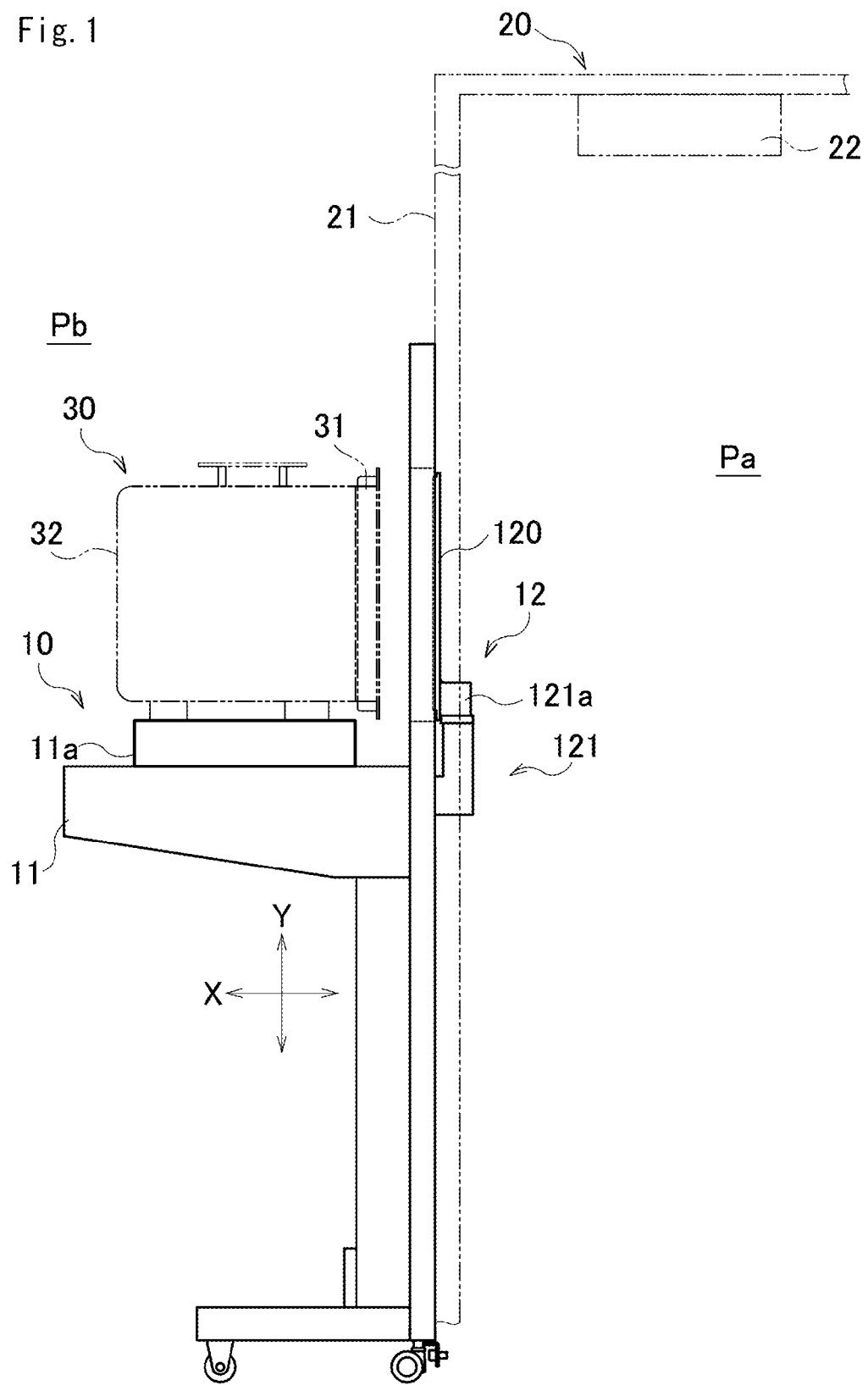
FIG. 1 is a side view of a load port device in accordance with one embodiment of the present claimed invention.

As shown in FIG. 1, a load port device 10 of this embodiment is utilized by being fixed to a mounting surface 21 of a semiconductor processing system 20, and a door 31 of the FOUP 30 type supported by a place table 11 is held by a door holding member 12 and the door 31 is open or closed by moving the door holding member 12 in a direction (horizontal direction) that is orthogonal to the mounting surface 21 and a direction (vertical direction) that is parallel to the mounting surface 21. In the following, the direction (a horizontal direction) that is orthogonal to the mounting surface 21 is also described as the first direction (x) and the direction (a vertical direction) that is parallel to the mounting surface 21 is also described as the second direction (Y).

The FOUP 30 comprises a body 32 inside of which a space for housing semiconductor wafers in the horizontal direction is formed and the door 31 that closes an opening of the body 32. The semiconductor wafers that are housed inside of the body 32 are stably supported in the inside of the body 32 by a retainer, not shown in drawings, comprising a spring or the like.

Figure 5:
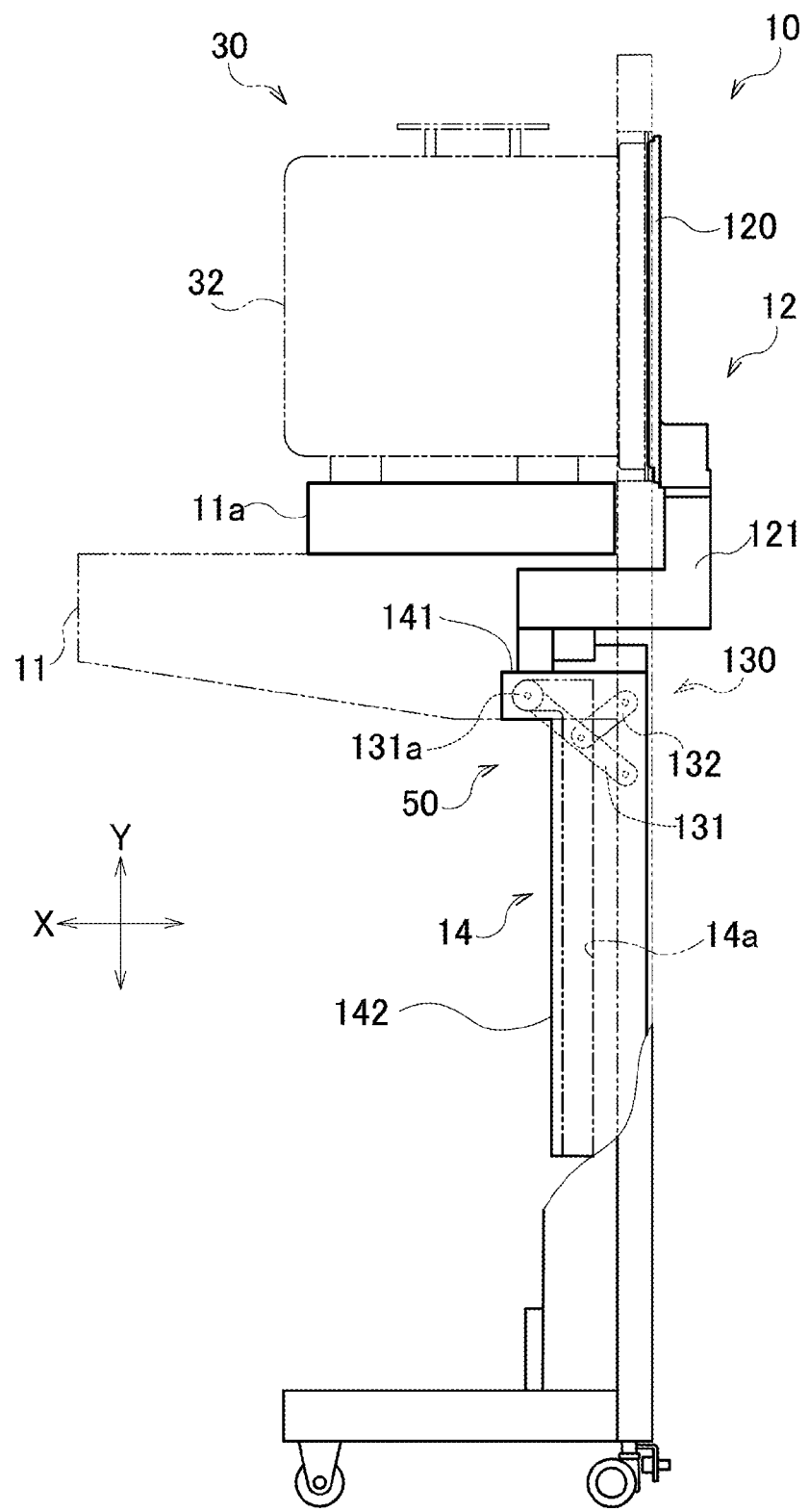
FIG. 5 is an explanatory view showing a movement of a link mechanism provided for the load port device.

The FOUP 30 is supported by an upper surface of the place table 11 through a FOUP support mechanism 11a. The FOUP support mechanism 11a is so configured to allow the FOUP 30 to make a reciprocating movement in the first direction (X) in a state of fixing the FOUP 30 that is supported by the FOUP support mechanism 11a so that the FOUP 30 can be separated from the semiconductor processing system 20 or can approach to the semiconductor processing system 20 so as to move from a state shown in FIG. 1 to a state shown in FIG. 5.

The door holding member 12 shown in FIG. 1 through FIG. 4 comprises a load port door 120 that holds the door 31 of the FOUP 30, a connecting part 121 that fixes the load port door 120 to one end 121a of the connecting part 121, a link connecting part 122 that is fixed to the other end 121b of the connecting part 121 and an open/close shaft engaging part 123 that is fixed to the other end 121b of the connecting part 121 through the link connecting part 122. The load port door 120 is a member whose shape is a generally rectangular shape whose size is generally the same as that of the door 31 of the FOUP 30, and is provided with a door holding mechanism, not shown in drawings, for holding the door 31. The connecting part 121 is a member that extends from the above-mentioned one end 121a to a vertically downward so as to bend in the first direction (X), and the link connecting part 122 is arranged on a bottom surface of a distal end part (the other end 121b) of a part that extends in the first direction (X). The link connecting part 122 is in a shape of a reverse "L" character in a front view, and an insertion bore 122a (refer to FIG. 4) is formed at a part that bends downward. The insertion bore 122a is to be inserted by a connecting shaft 131b arranged on one end 131d of a main moving link 131, to be described later. A groove 123a that extends in the first direction (X) and that opens downward is formed on the open/close shaft engaging part 123. The groove 123a is of a shape whose open part is locally narrowed toward the inside and then widened toward further inside, and is engaged with a door open/close shaft 134*b* as a guide rail arranged on a sub moving block 134, to be described later.

Figure 3:
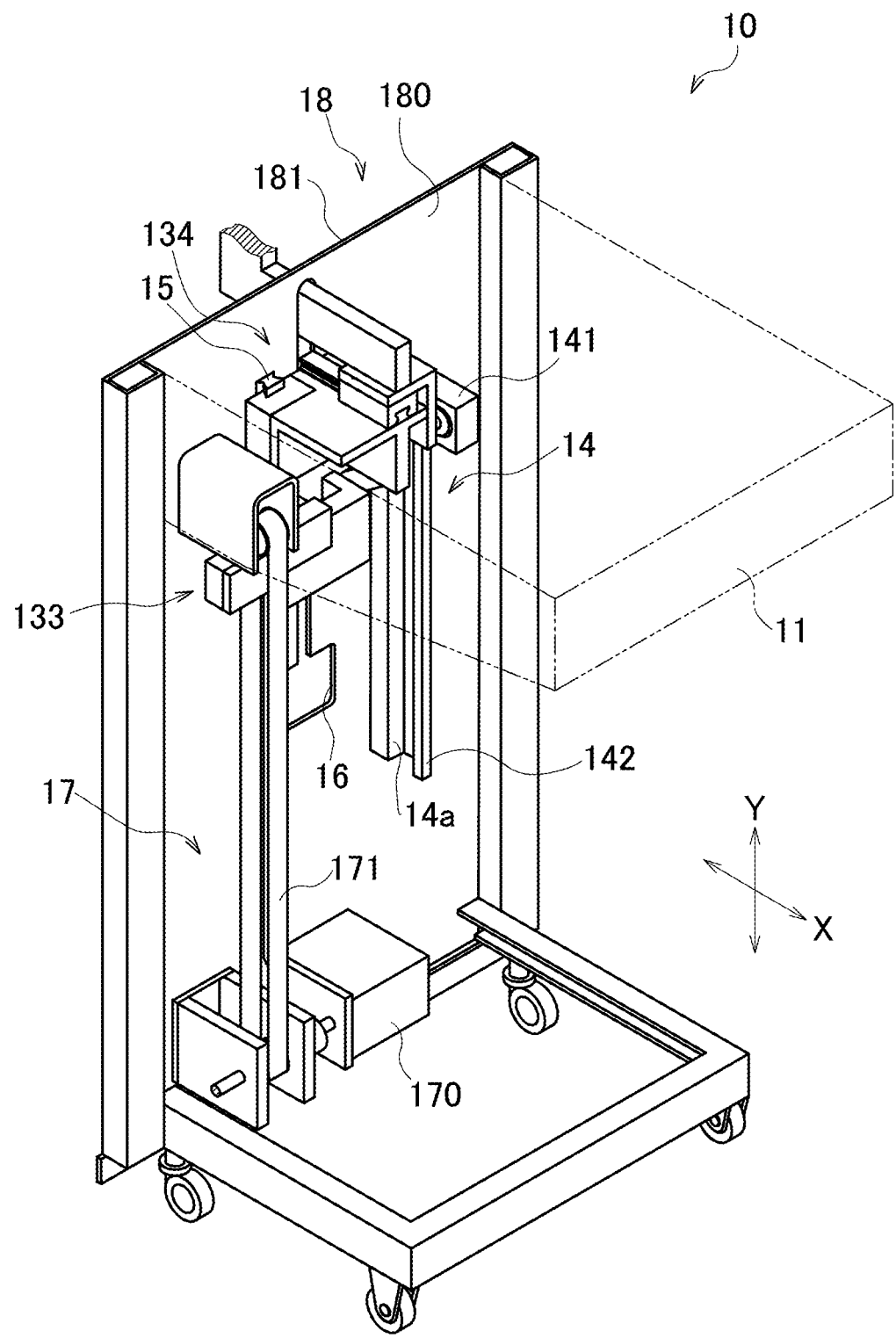
FIG. 3 is a perspective view of the load port device.
Figure 4:
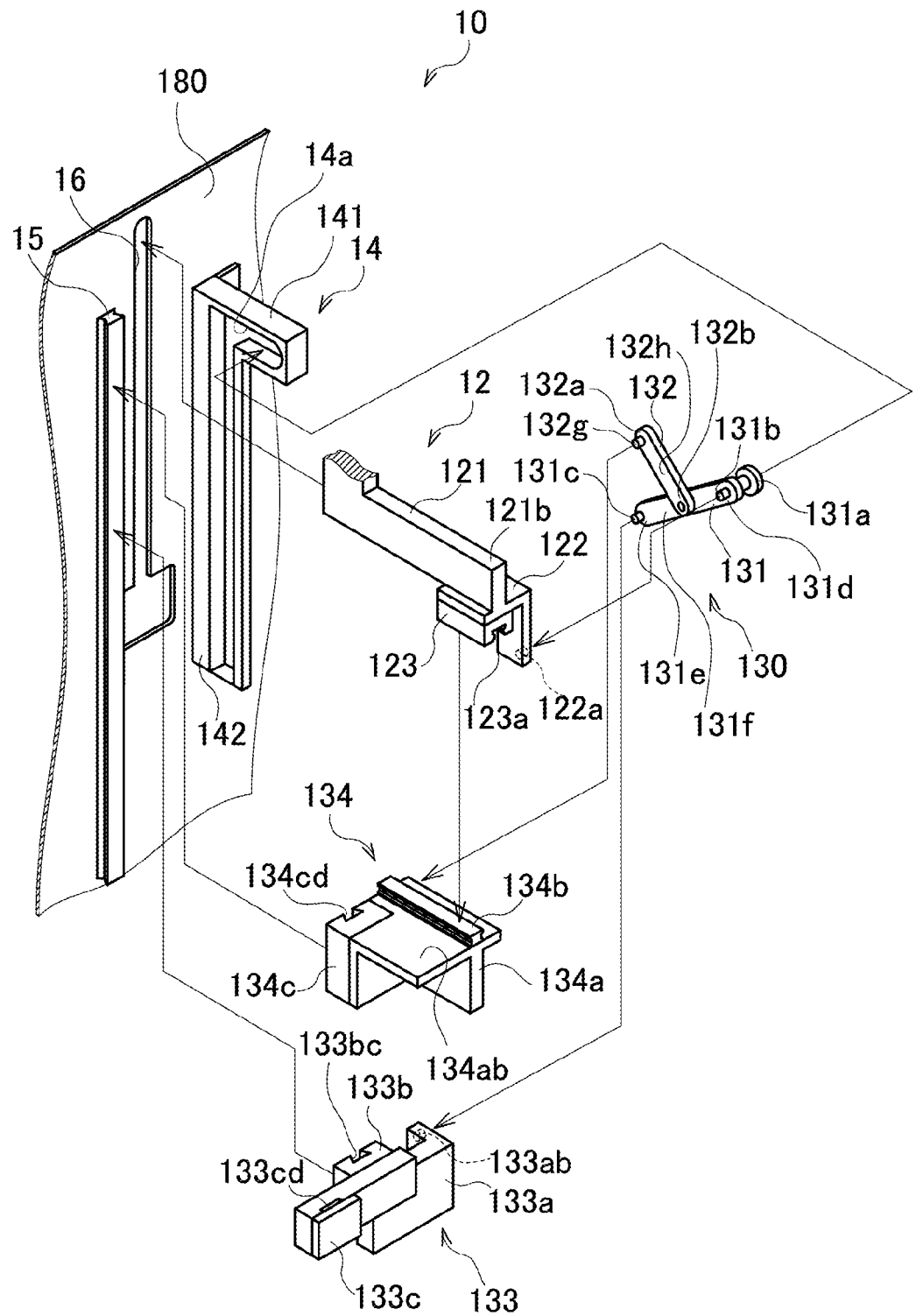
FIG. 4 is an exploded perspective view showing a principal part of the load port device.

As shown in FIG. 3 and FIG. 4, the above-mentioned one end 131*d* of the main moving link 131 is guided by a guide 14 as a guide member and connected with the door holding member 12 in a rotatable manner, and the other end 131*e* of the main moving link 131 is connected with a main moving block 133 in a rotatable manner. The main moving link 131 constitutes a link mechanism 130 together with a sub moving link 132 whose one end 132*b* is connected with a general center of the main moving link 131 in a rotatable manner and whose other end 132*a* is connected with the sub moving block 134 in a rotatable manner. The connecting shaft 131*b* is arranged on the above-mentioned one end 131*d* of one surface 131*f* of the main moving link 131, and the connecting shaft 131*c* is arranged on the other end 131*e* of the surface 131*f*. The connecting shaft 131*c* is inserted into an insertion bore 133*ab* formed on the link connecting part 133*a* of the main moving block 133. In addition, the sub moving link 132 faces the surface 131*f* of the main moving link 131, and a connecting shaft 132*g* is arranged on the other end 132*a* of the sub moving link 132. The connecting shaft 132*g* is arranged on a surface 132*h* of the sub moving link 132 that is an opposite side to a surface facing the main moving link 131 and inserted into an insertion bore, not shown in drawings, of the main moving block 133. A guide roller 131*a* that fits into a groove 14*a* of the guide 14 and moves inside of the groove 14*a* is connected in a rotatable manner with the one end 131*d* of the other surface of the main moving link 131. The guide 14 is a member in a shape of a reverse "L" character having a vertical part 142 extending in the second direction (Y) and a horizontal part 141 that projects from an upper end of the vertical part 142 in the first direction (X), and the groove 14*a* is formed on the vertical part 142 and the horizontal part 141 to face the other surface of the main moving link 131. Since the end 131*d* of the main moving link 131 moves along the guide 14 having the above-mentioned arrangement, in case that the door holding member 12 locates at a position whose height is generally the same as that of a position where the FOUP 30 is placed, the door holding member 12 that is connected with the end 131*d* of the main moving link 131 moves in the horizontal direction. In case that the door holding member 12 locates at a position whose height is at the same position or lower than the position where the FOUP 30 is placed, the door holding member 12 moves in the vertical direction.

The main moving block 133 that is connected with the end 131*d* of the main moving link 131 as shown in FIG. 3 and FIG. 4 makes a reciprocating movement along a door hoisting shaft 15 as a main shaft extending in the second direction (Y) by the driving device 17. The driving device 17 supports a toothed endless belt 171 by a driving shaft 172*a* (refer to FIG. 2) that rotates by a driving motor 170 and by a driven shaft 172*b* (refer to FIG. 2) that is arranged in a rotatable manner separated from the driving shaft 172*a* in the second direction (Y) so that the toothed endless belt 171 is configured in a rotatable manner. The main moving block 133 comprises a belt fixing part 133*c* that is fixed to the toothed endless belt 171, a main shaft engaging part 133*b* where a groove 133*bc* that extends in the second direction (Y) and that is open toward the door hoisting shaft 15 and the link connecting part 133*a* that is arranged between the belt fixing part 133*c* and the main shaft engaging part 133*b*. An opening 133*cd* to insert the toothed endless belt 171 in its thickness direction is formed on the belt fixing part 133*c*, and an insertion bore 133*ab* into which the connecting shaft 131*c* shown in FIG. 4 is inserted is formed on the link connecting part 133*a*. Each of the groove 133*bc* formed in the main shaft engaging part 133*b* and the groove 134*cd* formed on the main shaft engaging part 134*c*, to be described later, is of a shape whose open part is locally narrowed toward the inside and then widened toward further inside. The driving motor 170 is a numerical control driving motor 170 that acts as many as a predetermined number of rotations (pulse number).

Figure 2:
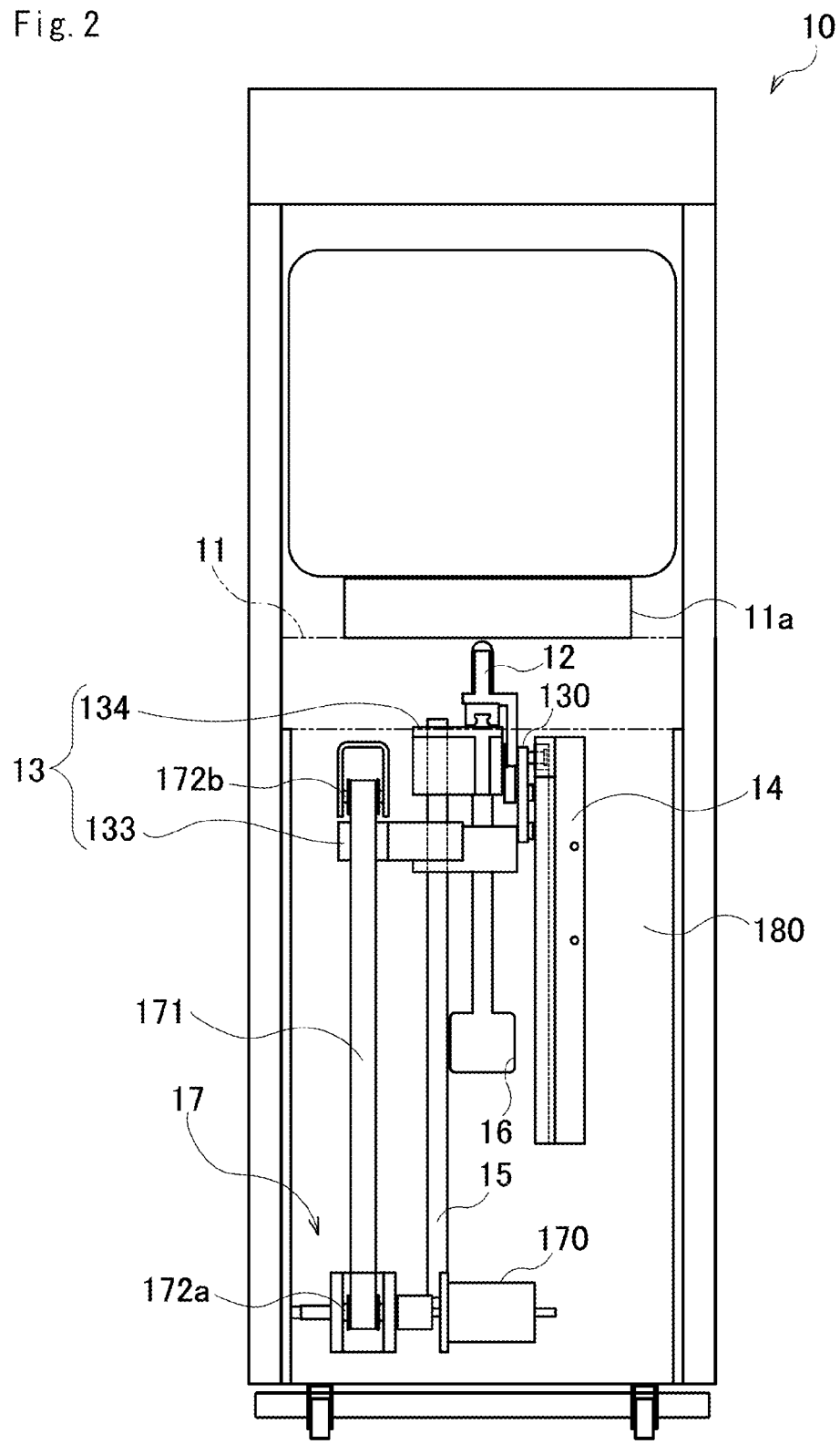
FIG. 2 is a front view of the load port device.

The sub moving block 134 to be connected with the other end 132*a* of the sub moving link 132 makes a reciprocating movement in the second direction (Y) by following the main moving block 133 shown in FIG. 3 and FIG. 4. As shown in FIG. 2, the sub moving block 134 constitutes a reciprocating movement device 13 that makes the link mechanism 130 reciprocating move together with the main moving block 133, and comprises the link connecting part 134*a* with which the end 131*d* of the main moving link 131 is connected, the main shaft engaging part 134*c* that is fixed to the link connecting part 134*a* and where the groove 134*cd* that extends in the second direction (Y) and that opens toward the door hoisting shaft 15 is formed, and the door open/close shaft 134*b* that is arranged on a top surface 134*ab* of the link connecting part 134*a* and that extends in the second direction (Y). A shape of the door open/close shaft 134*b* is that a center part of a surface of each side is dented in its extending direction and the groove 123*a* of the open/close shaft engaging part 123 is so formed to be engaged with the door open/close shaft 134*b* as shown in FIG. 3 and FIG. 4. Then, the engaged state between the sub moving block 134 and the open/close shaft engaging part 123 is not released even though the sub moving block 134 is moved downward so that it is possible to move the door holding member 12 associated with the movement of the sub moving block 134. Similar to the door open/close shaft 134*b*, a shape of the door hoisting shaft 15 is that a center part of a surface of each side is dented in its extending direction and the groove 133*bc* formed on the main shaft engaging part 133*b* of the main moving block 133 and the groove 134*cd* formed on the main shaft engaging part 134*c* of the sub moving block 134 are also formed to be engaged with the door hoisting shaft 15 having the above-mentioned shape as shown in FIG. 3 and FIG. 4. As a result, the main moving block 133 and the sub moving block 134 are not released from the door hoisting shaft 15 in the first direction (X) so that it is possible for the door hoisting shaft 15 to support the main moving block 133 and the sub moving block 134 in a state of being able to move. The door open/close shaft 134*b* and the groove 14*a* formed on the horizontal part 141 of the guide 14 extend by a length more than or equal to a travelling distance of the door holding member 12 in the first direction (X) and the groove 14*a* formed on the vertical part 142 of the guide 14 and the door hoisting shaft 15 extend by a length more than or equal to a travelling distance of the door holding member 12 in the first direction (X).

As shown in FIG. 1, FIG. 2 and FIG. 3, the door hoisting shaft 15, the guide 14 and the driving motor 170 are fixed to one surface 180 of the plate-shaped base member 18. The base member 18 constitutes one wall surface of the load port device 10, and the load port device 10 is fixed to the semiconductor processing system 20 in a state that the other surface 181 of the base member 18 makes an abutting contact with the mounting surface 21. A member insertion opening 16 that extends in the second direction (Y) between the door open/close shaft 134*b* and the guide 14 is formed on the base member 18. The door holding member 12 extends from the surface 180 side of the base member 18 to the other surface 181 side through the member insertion opening 16, and the surface 180 side is connected with the one end 131d of the main moving link 131 and the other surface 181 side holds the door holding member 12. In addition, the door holding member 12 moves in the second direction (Y) along the member insertion opening 16.

A cover, not shown in drawings, to cover the above-mentioned members arranged on the surface 180 side of the base member 18 is arranged on a bottom part of the place table 11.

In accordance with the load port device 10 having the above-mentioned arrangement, at a time of a door opening movement to open the door 31 of the FOUP 30, the toothed endless belt 171 makes a rotary movement driven by the driving motor 170 so that the main moving block 133 connected with the toothed endless belt 171 initiates a descending movement along the door hoisting shaft 15. At this time, since the guide roller 131a that is fixed to the end 131d of the main moving link 131 fits into the groove 14a of the horizontal part 141 of the guide 14, the guide roller 131a is prohibited from moving downward so that the guide roller 131a initiates moving in the horizontal direction toward the base member 18 shown in FIG. 3 or the like. In association with this movement of the guide roller 131a, the main moving link 131 makes a rotational movement around the door holding member 12 and the main moving block 133 so that an inclination to the vertical direction is decreased to make a state from the state shown in FIG. 5 to the state shown in FIG. 6. In addition, the sub moving link 132 also makes a rotational movement around the main moving link 131 and the sub moving block 134 so that an inclination to the vertical direction is decreased to make a state from the state shown in FIG. 5 to the state shown in FIG. 6. Furthermore, the door holding member 12 connected with the end 131d of the main moving link 131 moves in the horizontal direction along the door open/close shaft 134b (refer to FIG. 4) of the sub moving block 134 shown in FIG. 3. Due to this movement, the door 31 moves in the first direction (X).

Figure 6:
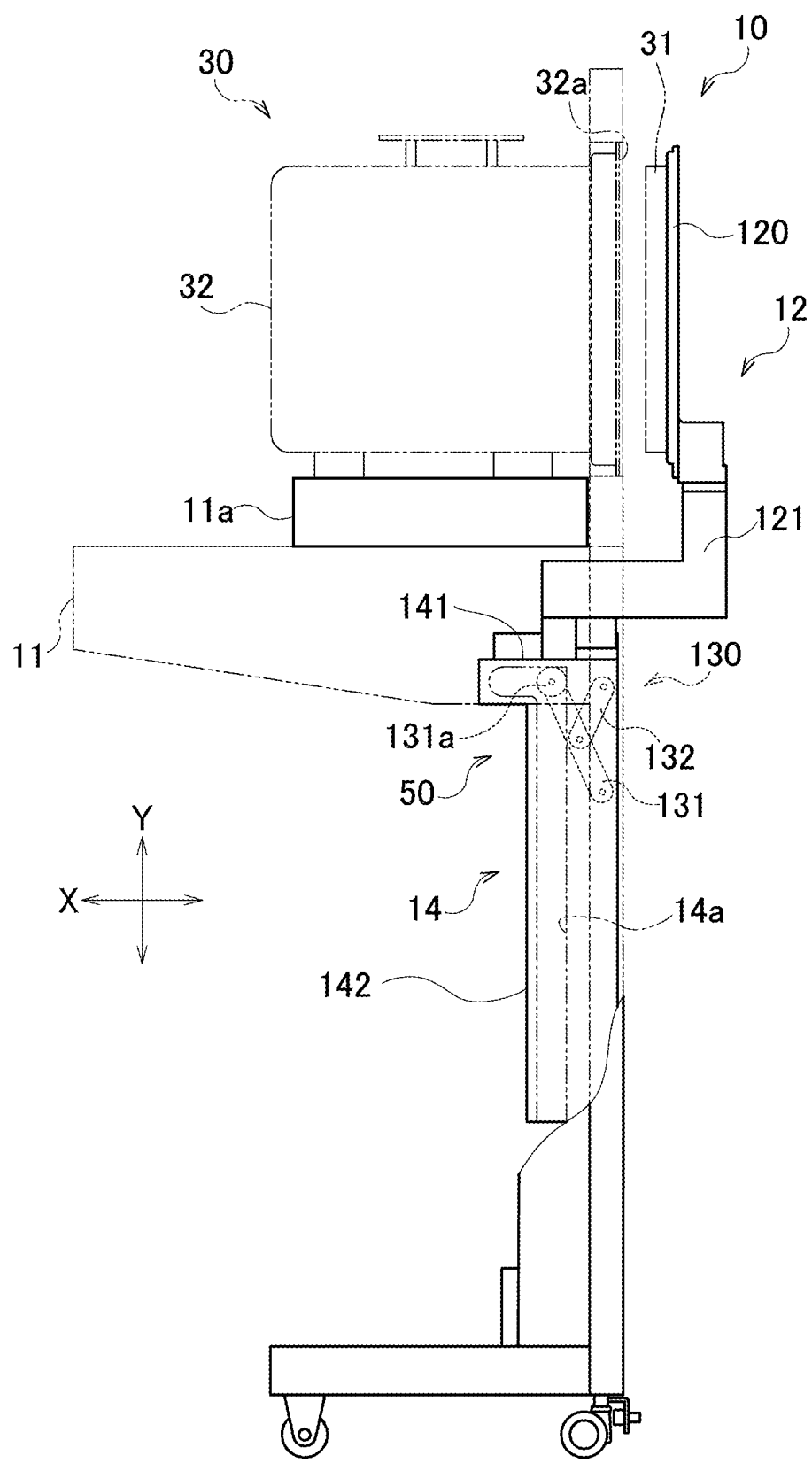
FIG. 6 is an explanatory view showing a movement of the link mechanism provided for the load port device.
Figure 7:
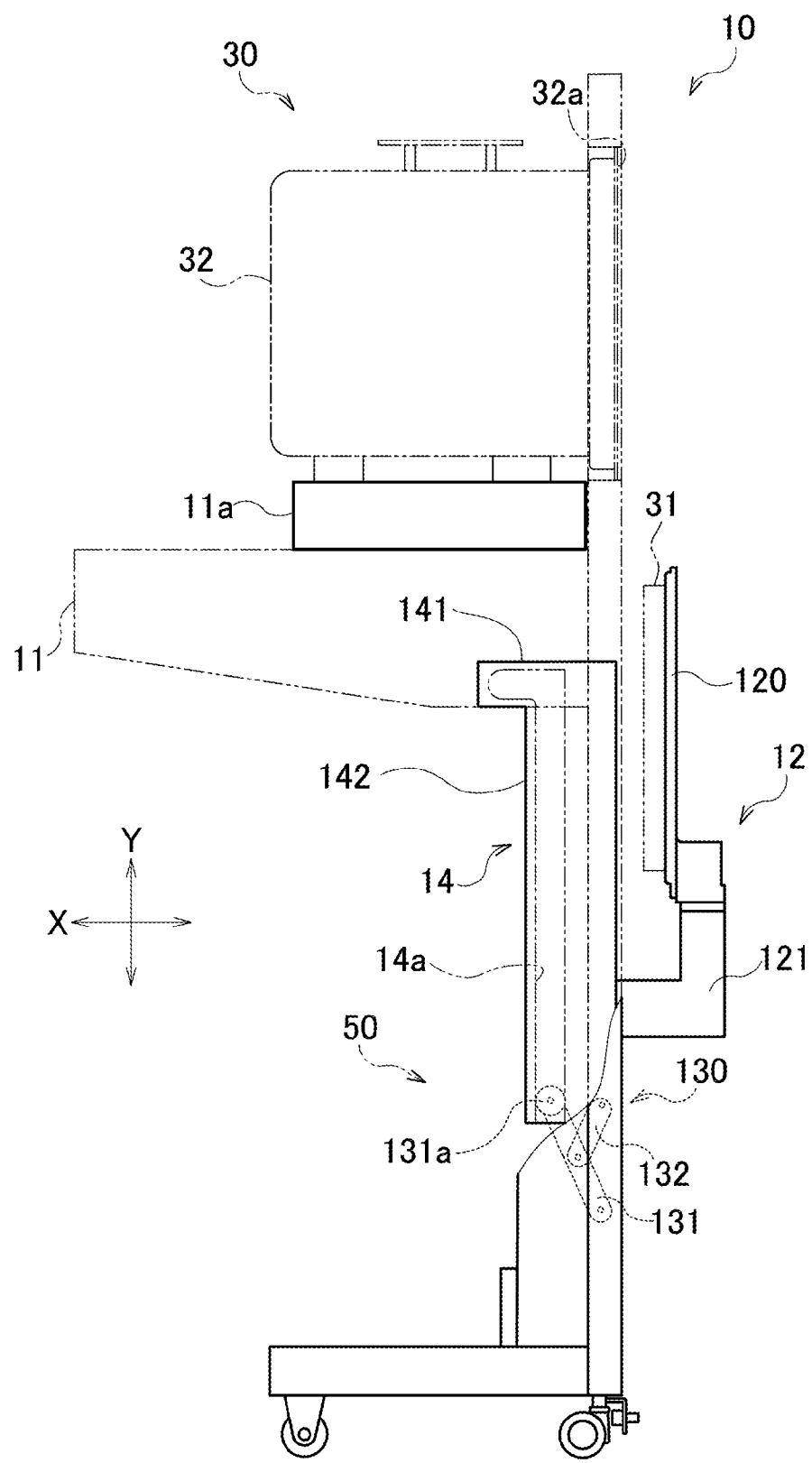
FIG. 7 is an explanatory view showing a movement of the link mechanism provided for the load port device.

When the guide roller 131a shown in FIG. 6 and FIG. 7 comes near to the vertical part 142 of the guide 14, the sub moving block 134 also initiates moving downward along the door hoisting shaft 15 so that the door 31 transfers from an opening movement to a descending movement. During the descending movement, both the main moving block 133 and the sub moving block 134 descend along the door hoisting shaft 15, and the guide roller 131a descends along the vertical part 142 of the guide 14. At this time, the main moving link 131 and the sub moving link 132 descend without changing the inclination at a time when the main moving link 131 and the sub moving link 132 come near to the vertical part 142 of the guide 14 so as to transfer a state from the state shown in FIG. 6 to the state shown in FIG. 7. Due to this movement, the door 31 descends, namely moves in the second direction (Y).

Next, at a time of a door close movement to close the door 31 of the FOUP 30, both the main moving block 133 and the sub moving block 134, shown in FIG. 3, rise along the door hoisting shaft 15, and the guide roller 131a, shown in FIG. 6 and FIG. 7, moves upward along the vertical part 142 of the guide 14, and then the door 31 rises by reversely turning the endless toothed belt 171 by driving the driving motor 170 in a reverse direction to a direction at a time of opening movement. At this time, the main moving link 131 and the sub moving link 132 move upward without changing the inclination so as to make a state from a state shown in FIG. 7 to a state shown in FIG. 6. When the guide roller 131a enters the horizontal part 141 of the guide 14, the sub moving block 134 is prohibited from moving upward so that a movement of the door 31 is transferred to the closing movement. In the door close movement, since the guide roller 131a fits into the groove 14a of the horizontal part 141 of the guide 14, the guide roller 131a is prohibited from moving upward even though the main moving block 133 moves upward so that the guide roller 131a initiates a movement in the horizontal direction so as to be separated from the base member 18 shown in FIG. 3. In association with this movement of the guide roller 131a, the main moving link 131 increases the inclination to the vertical direction while rotating around the door holding member 12 and the main moving block 133 so as to make a state from a state shown in FIG. 6 to a state shown in FIG. 5. In addition, the sub moving link 132 also increases the inclination to the vertical direction while rotating around the main moving link 131 and the sub moving block 134 so as to make a state from a state shown in FIG. 6 to a state shown in FIG. 5. Furthermore, the door holding member 12 moves in the horizontal direction along the door open/close shaft 134b of the sub moving block 134. At this time, the link mechanism 130 and the guide 14 shown in FIG. 3 and FIG. 4 constitute a tightening mechanism that produces a toggle function. The tightening mechanism 50 can transfer an upward driving force transmitted to the main moving block 133 to a pushing force in the first direction (X) due to the door holding member 12 by inclining the main moving link 131. In accordance with the tightening mechanism 50 having the above-mentioned arrangement, the inclination of the main moving link 131 becomes near horizontal so that it becomes possible to obtain an extremely big pressing force that is infinite in principle. The driving motor 170 as being the numerical control driving motor 170 halts when the driving motor 170 rotates as many as a predetermined rotational number (pulse number). With this arrangement, the door 31 halts at a position that is previously set.

As mentioned above, the load port device 10 of this embodiment supports the FOUP 30 as being the storage container that can house a plurality of semiconductor wafers and opens or closes the door 31 of the FOUP 30 by mutually moving the door 31 from the horizontal direction as being the first direction (X) to the vertical direction as being the second direction (Y), and comprises the door holding member 12 that holds the door 31 of the FOUP 30, the link mechanism 130 that has the main moving link 131 whose one end 131d is connected with the door holding member 12 in a rotatable manner, the guide 14 as being the guide device that bends and extends from the horizontal direction to the vertical direction and that guides the one end 131d of the main moving link 131, the reciprocating moving device 13 that has at least one main moving block 133 as being the main moving member with which the other end 131e of the main moving link 131 is connected in a rotatable manner and that allows the door holding member 12 to make a reciprocating movement, the door hoisting shaft 15 as being the main shaft that extends in the vertical direction and that moves the main moving block 133 in the extending direction, and the driving device 17 that drives the main moving block 133 along the door hoisting shaft 15, and the link mechanism 130 is so configured that the one end 131d of the main moving link 131 is allowed to move from the horizontal direction to the vertical direction or from the vertical direction to the horizontal direction along the guide 14 in a state that the other end 131e of the main moving link 131 moves to the vertical direction.

With the above-mentioned arrangement, the one end 131d of the main moving link 131 moves from the horizontal direction to the vertical direction or from the vertical direction to the horizontal direction along the guide 14 in conjunction with the reciprocal movement of the main moving block 133 in the vertical direction. As a result, it is possible to open or close the door 31 of the FOUP 30 held by the door holding member 12 with a smooth movement of each member 133, 134, 130 just by activating the main moving block 133 on the single door hoisting shaft 15 so that it is possible to restrain generation of particles and to smoothly open and close the door 31. In addition, since the main moving link 131 is used to transfer the moving force of the main moving block 133 in the vertical direction to the moving force of the door holding member 12 in the vertical direction, it is possible to smoothly transfer the moving force so that generation of the particles can be furthermore prevented. Furthermore, since only one door hoisting shaft 15 is required, it is possible both to simplify the configuration of the system and to make a number of the driving source single, thereby restraining the manufacturing cost.

As a concrete configuration, the reciprocating moving device 13 further comprises the sub moving block 134 that is supported by the door hoisting shaft 15 in a state of being able to move in the vertical direction and being separated from the main moving block 133, the link mechanism 130 further comprises the sub moving link 132 whose one end 132b is connected with the main moving link 131 in a rotatable manner and whose other end 132a is connected with the sub moving block 134 in a rotatable manner, and the door holding member 12 is supported by the sub moving block 134 in a state of being able to move in the horizontal direction.

In accordance with this arrangement, in case that the main moving block 133 and the end 131d of the main moving link 131 move in the vertical direction, since the sub moving block 134 that is connected with the main moving block 133 through the main link 131 and the sub moving link 132 also moves in the vertical direction, it is possible to smoothly and stably move the door holding member 12 supported by the sub moving block 134. In addition, in case that the end 131d of the main moving link 131 moves in the horizontal direction in association with the movement of the main moving block 133 in the vertical direction, since the angle of the main moving link 131 to the sub moving link 132 changes, the position of the sub moving block 134 does not change. As a result of this, it is possible to move the door holding member 12 connected with the end 131d of the main moving link 131 in the horizontal direction in a state of being supported by the sub moving block 134 so that the door holding member 12 can be moved smoothly and stably in the horizontal direction.

In addition, since the link mechanism 130 and the guide 14 constitutes the tightening mechanism 50 that produces the toggle effect in case that the other end 131e of the main moving link 131 moves in the vertical direction and the one end 131d of the main moving link 131 moves in the horizontal direction in order to close the door 31, it is possible to give the high tightening force to the door holding member 12 due to this toggle effect so that the door 31 can be pushed against the FOUP 30 with a strong force at a time of closing the door 31. With this arrangement, it is possible to omit an additional tightening mechanism. In addition, the retainer overcomes a force to push the door 31 of the FOUP 30 outside by pushing the door 31 against the FOUP 30 with the strong force so that the door 31 of the FOUP 31 can be closed. Furthermore, since the door holding member 12 moves in the direction orthogonal to the mounting surface 32a of the door 31 of the FOUP 30, it is possible to increase the force to close the door 31 through the above-mentioned toggle effect.

In addition, since the plate shape base member 18 to one surface 180 of which the guide 14 and the door hoisting shaft 15 are fixed is further comprised, the member insertion opening 16 that extends in the vertical direction and through which the door holding member 12 is inserted and passes is formed on the base member 18, and the door holding member 12 extends from one surface 180 side of the base member 18 to the other surface 181 side of the base member 18 through the member insertion opening 16 so that it is connected with one end 131d of the main moving link 131 on the one surface 180 side and holds the door 31 on the other surface 181 side, even though particles generates on the door hoisting shaft 15 or the like, the particles are difficult to enter inside of the semiconductor processing system 20.

The reason is that the door holding member 12 moves in the horizontal direction inside of the member insertion opening 16 in case that the main moving link 131 moves in the horizontal direction, and the door holding member 12 moves in the vertical direction inside of the member insertion opening 16 in case that the main moving link 131 moves in the vertical direction. As mentioned, since the door holding member 12 arranged in the other surface 181 side of the base member 18 can be moved by moving the link mechanism 130 arranged in one surface 180 side of the base member 18, in case that the load port device 10 of this invention is mounted on the semiconductor processing system 20 as shown in FIG. 1, the door holding member 12 can be arranged inside of the semiconductor processing system 20 and the door holding member 12 can be moved by means of the link mechanism 130 and the door hoisting shaft 15 that are arranged outside of the semiconductor processing system 20. As a result of this, particles floating outside of the semiconductor processing system 20 are difficult to enter inside of the semiconductor processing system 20 so that it is possible to prevent the semiconductor wafers arranged inside of the semiconductor processing system 20 from being contaminated due to particles.

In addition, the semiconductor processing system 20 on which the load port device 10 of this invention is mounted comprises a gas supply device 22 that supplies a gas to inside of the semiconductor processing system 20 as shown in FIG. 1, and a pressure (Pa) in the inside of the semiconductor processing system 20 can be set higher than a pressure (Pb) in the outside of the semiconductor processing system 20. With this arrangement, since the air in the outside of the semiconductor processing system 20 is difficult to flow inside of the semiconductor processing system 20 so that it is possible to further prevent the particles that float outside of the semiconductor processing system 20 from entering inside of the semiconductor processing system 20, it is possible to further prevent the semiconductor wafers from being contaminated. Furthermore, since it is possible for the load port device 10 of this invention to restrain vibration associated with an opening/closing movement of the door 31 of the FOUP 10, it is possible to stabilize an airflow that flows from the semiconductor processing system 20 to the inside of the body 32 of the FOUP 30 so that the particles generated by air turbulence associated with the vibration of the door holding member 12 can be restrained.

A concrete arrangement of each component is not limited to the above-mentioned embodiment.

For example, the first direction is set as the horizontal direction and the second direction is set as the vertical direction in this embodiment, however, the first direction and the second direction are set as the direction other than the horizontal direction and the vertical direction.

In addition, the main moving block 133 in this embodiment moves in accordance with a rotational movement of the toothed endless belt 171, however, for example, a ball screw or a hoist unit that makes a reciprocating movement in the vertical direction may be used as a device to move the main moving block 133.

Figure 8:
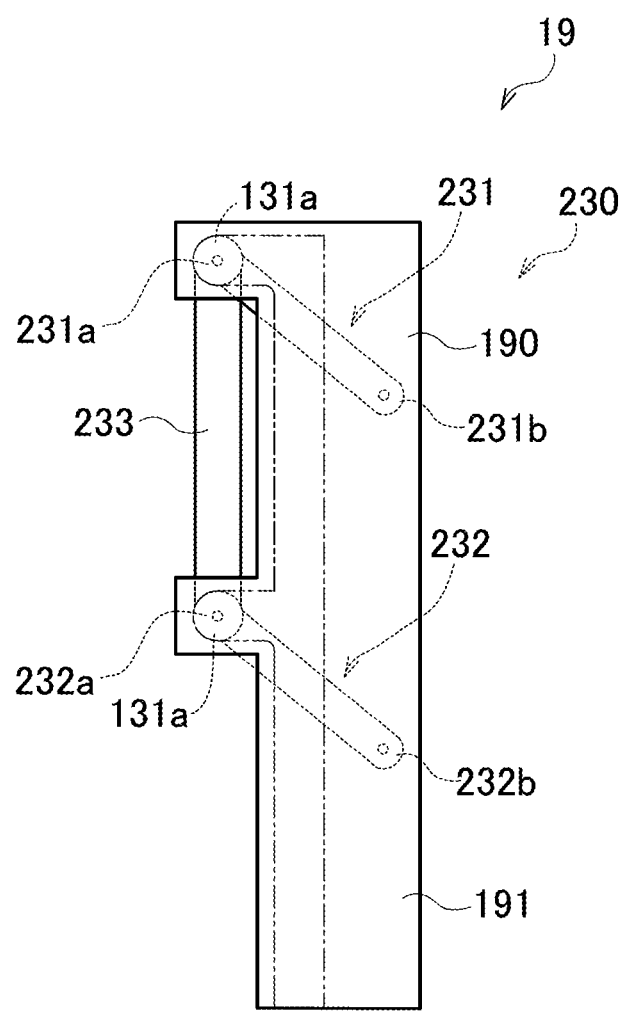
FIG. 8 is a view showing a modified embodiment of the load port device.

Furthermore, the link mechanism may comprise the main moving link 131 alone, or a parallel link mechanism 230 as shown in FIG. 8 may be used as the link mechanism. In this case, for example, the reciprocating movement device does not comprise the sub moving block 134 and comprises a first moving block having the same structure as that of the main moving block 133 (refer to FIG. 3) and a second moving block that can move in the vertical direction along the door hoisting shaft 15 driven by the driving device 17. In addition, the guide 19 has a first guide part 191 having the same structure and a second guide part 190 continuously arranged above the first guide part 191. The parallel link mechanism 230 comprises a link 231 whose one end 231a is guided by the second guide part 190 and whose other end is connected with the second moving block in a rotatable manner, a main moving link 232 whose one end 232a is guided by the first guide part 191 and whose other end 232b is connected with the first moving block in a rotatable manner, a link 233 connected with the end 231a of the link 231 and the end 232a of the main moving link 232 in a rotatable manner and a toothed belt 171 (refer to FIG. 3) with which the first moving block and the second moving block are connected respectively. The link 231 and the main moving link 232 constitute the parallel link, and the link 233 and the toothed belt 171 constitute the parallel link. Furthermore, a mechanism, not shown in drawings, to make the door holding member 12 movable in the first direction (X) in a state that the second moving block moves in the vertical direction is provided between the second moving block and the door holding member 12 so that the door holding member 12 is supported by the second moving block in a movable state in the first direction (X).

With the arrangement comprising the above-mentioned parallel link mechanism 230, in case that the first moving block, the second moving block, and the end 231a and the end 232a of each link 231, 232 move in the vertical direction, it is possible to smoothly and stably move the door holding member 12 supported by the second moving block in the vertical direction. In addition, in case that the end 231a and the end 232a of each link 231, 232 move in the horizontal direction associated with the movement of the first moving block and the second moving block in the vertical direction, since each link 231, 232 rotates around the first moving block and the second block so that an inclination of each link 231, 232 changes, the position where the first moving block and the second moving block locate does not change. As a result, it is possible to move the door holding member 12 connected with the end 231d of the link 231 in the horizontal direction in a state that the door holding member 12 is supported by the second moving block so that it is possible to smoothly and stably move the door holding member 12 in the horizontal direction.

In addition, with the above-mentioned arrangement, the link 231 and the main moving link 232 may be connected with a link other than the toothed belt 171. Furthermore, the link 233 is not limited to an arrangement wherein the one end 231a of the link 231 is connected with the one end 232a of the main moving link 232, and may be an arrangement wherein a center part of the link 231 and a center part of the link 232 are connected.

Other arrangement may be variously modified without departing from a spirit of this invention.

EXPLANATION OF CODES

10 . . . load port device
12 . . . door holding member
13 . . . reciprocating movement device
14, 19 . . . guide (guide device)
15 . . . door hoisting shaft (main shaft)
17 . . . driving device
13 . . . FOUP (storage container)
31 . . . door
32a . . . mounting surface
50 . . . tightening mechanism
130 . . . link mechanism
131, 232 . . . main moving link
131d . . . one end of link
131e . . . other end of link
132 . . . sub moving link
132a . . . other end of link
132b . . . one end of link
133 . . . main moving block (moving member)
134 . . . sub moving block
190 . . . second guide part
191 . . . first guide part
230 . . . parallel link mechanism (link mechanism)
231 . . . link
231a . . . one end of link
231b . . . other end of link

The invention claimed is:

1. A load port device that supports a storage container that can house a plurality of semiconductor wafers and that opens or closes the storage container by moving a door of the storage container in a first direction and a second direction, the second direction being different from the first direction, the load port device comprising,
  a door holding member that holds the door of the storage container,
  a link mechanism comprising a main moving link whose one end is connected with the door holding member in a rotatable manner,
  a guide device that bends and extends from the first direction to the second direction and that guides the one end of the main moving link,
  a reciprocating moving device comprising at least one main moving member with which the other end of the main moving link is connected in a rotatable manner and that allows the door holding member to make a reciprocating movement,
  a main shaft that extends in the second direction and that moves the main moving member in the extending direction, and
  a driving device that drives the main moving member along the main shaft,
  wherein the link mechanism is so configured that the one end of the main moving link is allowed to change a movement from the first direction to the second direction or from the second direction to the first direction along the guide device when the other end of the main moving link moves in the second direction,
  wherein the reciprocating moving device further comprises a sub moving member that is supported by the main shaft in a state of being able to move in the second direction and being separated from the main moving member, wherein the link mechanism further comprises a sub moving link whose one end is connected with the main moving link in a rotatable manner and whose other end is connected with the sub moving member in a rotatable manner, and wherein the door holding member is supported by the sub moving member in a state of being able to move in the first direction.

2. The load port device described in claim 1, wherein the link mechanism and the guide device constitute a tightening mechanism that produces a toggle effect in a case that the other end of the main moving link moves in the second direction and the one end of the main moving link moves in the first direction in order to close the door.

3. The load port device described in claim 2, wherein the first direction is a direction generally orthogonal to a mounting surface of the door of the storage container.

4. The load port device described in claim 3, further comprising a plate shape base member to one surface of which the guide device and the main shaft are fixed, wherein
  a member insertion opening that extends in the second direction and through which the door holding member is inserted and passes is formed on the base member, and
  the door holding member extends from the one surface side of the base member to the other surface side of the base member through the member insertion opening so that it is connected with the one end of the main moving link on the one surface side of the base member and it holds the door on the other surface side of the base member.

5. A load port device that supports a storage container that can house a plurality of semiconductor wafers and that opens or closes the storage container by moving a door of the storage container in a first direction and a second direction, the second direction being different from the first direction, the load port device comprising,
  a door holding member that holds the door of the storage container,
  a link mechanism comprising a main moving link whose one end is connected with the door holding member in a rotatable manner,
  a guide device that bends and extends from the first direction to the second direction and that guides the one end of the main moving link,
  a reciprocating moving device comprising at least one main moving member with which the other end of the main moving link is connected in a rotatable manner and that allows the door holding member to make a reciprocating movement,
  a main shaft that extends in the second direction and that moves the main moving member in the extending direction, and
  a driving device that drives the main moving member along the main shaft,
  wherein the link mechanism is so configured that the one end of the main moving link is allowed to change a movement from the first direction to the second direction or from the second direction to the first direction along the guide device when the other end of the main moving link moves in the second direction,
  wherein the reciprocating moving device further comprises a second moving member that is driven by the driving device and that can move in the second direction along the main shaft,
  wherein the guide device comprises a first guide part and a second guide part whose shape is the same as that of the first guide part,
  wherein the link mechanism constitutes a parallel link by a link whose one end is guided by the second guide part and whose other end is connected with the second moving member in a rotatable manner and the main moving link, and
  wherein the door holding member is supported by the second moving member in a state of being able to move in the first direction.

6. The load port device described in claim 5, wherein the link mechanism and the guide device constitute a tightening mechanism that produces a toggle effect in a case that the other end of the main moving link moves in the second direction and the one end of the main moving link moves in the first direction in order to close the door.

7. The load port device described in claim 6, wherein the first direction is a direction generally orthogonal to a mounting surface of the door of the storage container.

8. The load port device described in claim 7, further comprising a plate shape base member to one surface of which the guide device and the main shaft are fixed, wherein
  a member insertion opening that extends in the second direction and through which the door holding member is inserted and passes is formed on the base member, and
  the door holding member extends from the one surface side of the base member to the other surface side of the base member through the member insertion opening so that it is connected with the one end of the main moving link on the one surface side of the base member and it holds the door on the other surface side of the base member.

9. A load port device that supports a storage container that can house a plurality of semiconductor wafers and that opens or closes the storage container by moving a door of the storage container in a first direction and a second direction, the second direction being different from the first direction, the load port device comprising,
  a door holding member that holds the door of the storage container,
  a link mechanism comprising a main moving link whose one end is connected with the door holding member in a rotatable manner,
  a guide device that bends and extends from the first direction to the second direction and that guides the one end of the main moving link,
  a reciprocating moving device comprising at least one main moving member with which the other end of the main moving link is connected in a rotatable manner and that allows the door holding member to make a reciprocating movement,
  a main shaft that extends in the second direction and that moves the main moving member in the extending direction, and
  a driving device that drives the main moving member along the main shaft,
  wherein the link mechanism is so configured that the one end of the main moving link is allowed to change a movement from the first direction to the second direction or from the second direction to the first direction along the guide device when the other end of the main moving link moves in the second direction, wherein the link mechanism and the guide device constitute a tightening mechanism that produces a toggle effect in a case that the other end of the main moving link moves in the second direction and the one end of the main moving link moves in the first direction in order to close the door, wherein the first direction is a direction generally orthogonal to a mounting surface of the door of the storage container, wherein the load port device further comprising a plate shape base member to one surface of which the guide device and the main shaft are fixed, wherein a member insertion opening that extends in the second direction and through which the door holding member is inserted and passes is formed on the base member, and wherein the door holding member extends from the one surface side of the base member to the other surface side of the base member through the member insertion opening so that it is connected with the one end of the main moving link on the one surface side of the base member and it holds the door on the other surface side of the base member.

* * * * *